(12) United States Patent
Petroni et al.

(10) Patent No.: US 10,153,713 B2
(45) Date of Patent: Dec. 11, 2018

(54) DEVICE FOR HARVESTING ENERGY FROM A FLUIDIC FLOW INCLUDING A THIN FILM OF PIEZOELECTRIC MATERIAL

(71) Applicant: FONDAZIONE ISTITUTO ITALIANO DI TECNOLOGIA, Genoa (IT)

(72) Inventors: Simona Petroni, Milan (IT); Francesco Rizzi, Bari (IT); Francesco Guido, Lecce (IT); Massimo De Vittorio, Lecce (IT)

(73) Assignee: Fondzione Istituto Italiano Di Tecnologia, Genoa (IT)

( * ) Notice: Subject to any disclaimer, the term of this patent is extended or adjusted under 35 U.S.C. 154(b) by 114 days.

(21) Appl. No.: 15/303,102

(22) PCT Filed: Apr. 10, 2015

(86) PCT No.: PCT/IB2015/052626
§ 371 (c)(1),
(2) Date: Oct. 10, 2016

(87) PCT Pub. No.: WO2015/155746
PCT Pub. Date: Oct. 15, 2015

(65) Prior Publication Data
US 2017/0033713 A1 Feb. 2, 2017

(30) Foreign Application Priority Data
Apr. 11, 2014 (IT) ............... TO2014A0313

(51) Int. Cl.
*H02N 2/18* (2006.01)
*H01L 41/113* (2006.01)
*H01L 41/08* (2006.01)
*H01L 41/047* (2006.01)

(52) U.S. Cl.
CPC ........... *H02N 2/185* (2013.01); *H01L 41/047* (2013.01); *H01L 41/0815* (2013.01); *H01L 41/1136* (2013.01)

(58) Field of Classification Search
CPC ... H02N 2/185; H01L 41/113; H01L 41/0815; H01L 41/1136
See application file for complete search history.

(56) References Cited

U.S. PATENT DOCUMENTS 6,424,079 B1 7/2002 Carroll
8,067,878 B1* 11/2011 Lu ..................... H02N 2/185
                                                    310/339
(Continued)

FOREIGN PATENT DOCUMENTS

CN 102220941 A 10/2011
JP H11-303726 A 11/1999
(Continued)

OTHER PUBLICATIONS

PCT, International Search Report and Written Opinion of the International Searching Authority, International Application No. PCT/IB2015/052626, 15 pages (dated Jul. 10, 2015).
(Continued)

*Primary Examiner* — J. San Martin
(74) *Attorney, Agent, or Firm* — FisherBroyles, LLP; Susan M. Oiler

(57) ABSTRACT

A device for harvesting energy from a fluidic flow, including a flexible structure formed by: a base layer; a conductive layer, made of a conductive material and laid on the base layer; and a piezoelectric layer, made of a piezoelectric material and laid on the conductive layer. The base layer, the conductive layer, and the piezoelectric layer form a crystalline structure including a plurality of pseudomorphic portions.

10 Claims, 8 Drawing Sheets

(56) References Cited

U.S. PATENT DOCUMENTS

| | | | |
|---|---|---|---|
| 8,400,046 B2* | 3/2013 | Hayamizu | B62M 3/08 |
| | | | 310/332 |
| 9,006,919 B2* | 4/2015 | Lynch | F03B 17/06 |
| | | | 290/54 |
| 2010/0164231 A1* | 7/2010 | Tsou | F03D 5/00 |
| | | | 290/55 |
| 2013/0093290 A1* | 4/2013 | Fox | H01L 41/081 |
| | | | 310/357 |
| 2013/0119669 A1* | 5/2013 | Murphree | H01L 41/125 |
| | | | 290/54 |
| 2015/0145374 A1* | 5/2015 | Xu | B06B 1/0644 |
| | | | 310/317 |
| 2017/0301853 A1* | 10/2017 | Xia | H01L 41/083 |

FOREIGN PATENT DOCUMENTS

| | | | | |
|---|---|---|---|---|
| JP | WO 2006109362 A1 * | 10/2006 | | F03D 5/06 |
| JP | WO 2013186965 A1 * | 12/2013 | | H01L 41/1136 |
| JP | WO 2015136864 A1 * | 9/2015 | | H01L 41/1136 |
| WO | WO 8405010 A1 * | 12/1984 | | H02N 2/185 |
| WO | WO 2012151436 A1 * | 11/2012 | | F03B 13/02 |

OTHER PUBLICATIONS

Lee, Si-Hung et al., "Grown of highly c-axis textured AlN films on Mo electrodes for film bulk acoustic wave resonators," J. Vac. Sci. Technol. A, vol. 21, No. 1, pp. 1-5 (2002).

* cited by examiner

DEVICE FOR HARVESTING ENERGY FROM A FLUIDIC FLOW INCLUDING A THIN FILM OF PIEZOELECTRIC MATERIAL

CROSS-REFERENCE TO RELATED APPLICATIONS

This application is a National Stage filing of International Application No. PCT/IB2015/052626, filed Apr. 10, 2015, which claims priority of Italian Application No. TO2014A000313, filed Apr. 11, 2014, which are incorporated herein by reference in their entireties.

TECHNICAL FIELD

The present invention relates to a device for harvesting energy from a fluidic flow. In particular, the present invention regards a device including a thin film of piezoelectric material.

BACKGROUND ART

As is known, there are available today numerous types of energy-harvesting systems, which enable recovery of energy via a mechanical system driven by a natural element, such as, for example, wind.

For instance, the U.S. Pat. No. 6,424,079, describes an energy-harvesting system, which comprises a flexible central layer, made of dielectric material, and a first layer and a second layer of piezoelectric material (polyvinylidene fluoride, PVDF). In addition, the energy-harvesting system forms a plurality of piezoelectric elements, electrically separated from one another, each of which is constituted by a pair of electrodes arranged on opposite sides of one between the first and second layers of piezoelectric material. The thickness of the central layer is comprised between 100 μm and 110 μm. Further, each of the first and second layers of piezoelectric material has a thickness comprised between 100 μm and 110 μm.

The energy-harvesting system described in the U.S. Pat. No. 6,424,079 is particularly efficient in the case where it operates within a liquid, in which case it enables harvesting of appreciable amounts of energy. However, in the case where the energy-harvesting system is immersed in a gas, the high stiffness does not enable optimization of the amount of energy recovered. In this connection, it should further be considered how the solution of reducing the stiffness by reducing the thickness of the first and second layers of piezoelectric material is not practicable. In fact, in order to exhibit a piezoelectric behaviour, PVDF must be subjected to a high tensile stress. Thus, at present a PVDF layer with piezoelectric behaviour may not have a thickness of less than about tens of micrometers; otherwise, there is the risk of failure.

DISCLOSURE OF INVENTION

The aim of the present invention is thus to provide an energy-harvesting device that will overcome at least in part the drawbacks of the known art.

According to the invention an energy-harvesting device is provided as defined in the annexed claims.

BRIEF DESCRIPTION OF THE DRAWINGS

For a better understanding of the invention, embodiments thereof are now described purely by way of non-limiting example and with reference to the attached drawings, wherein.

BEST MODE FOR CARRYING OUT THE INVENTION

Figure 1:
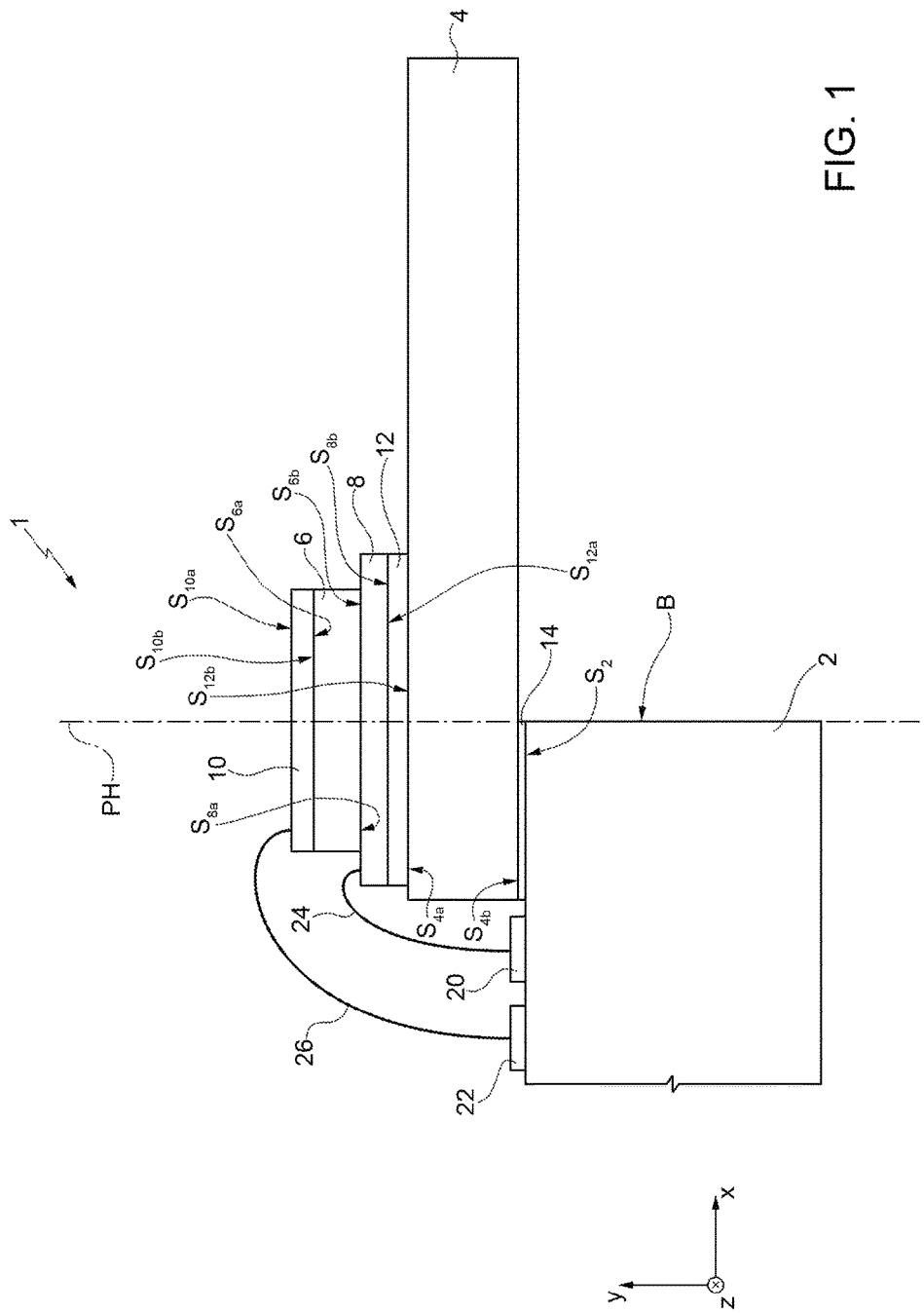
FIGS. 1 and 5 are schematic cross-sectional views of portions of embodiments of the present energy-harvesting device.

FIG. 1 shows an energy-harvesting device 1, which comprises: a supporting element 2 of a rigid type; a layer 4, referred to hereinafter as "flexible layer" 4; a first piezoelectric layer 6; a first conductive layer 8 and a second conductive layer 10; a layer referred to hereinafter as "base layer" or "interlayer" 12; and a bonding layer 14. In general, in the present description, the characteristics "flexible" and "rigid" of a given element are to be understood as referring to the capacity of this element to undergo dynamic deformation, or else not to undergo deformation, when the energy-harvesting device 1 is in use, i.e., when it is immersed, for example, in a flow of fluid having a rate of between 0.01 m/s and 20 m/s, as described hereinafter. In this connection, even though just the layer 4 is explicitly defined as flexible, also the first piezoelectric layer 6, the first and second conductive layers 8, 10, and the base layer 12 are flexible, i.e., deformable, and thus form a flexible structure together with the flexible layer 4. Furthermore, for reasons of simplicity of illustration, FIG. 1, as on the other hand also FIG. 5, refer to an ideal condition of the energy-harvesting device 1 where the elements that make it up are not deformed, and thus the layers have substantially parallelepipedal shapes. In actual fact, this condition is not stable since, on account of the action of the weight and of the presence of residual stress within the energy-harvesting device 1, the latter undergoes deformation even in the absence of fluidic flow. Consequently, also in the presence of a laminar flow of fluid, the energy-harvesting device 1 induces turbulence in the fluidic flow, with consequent oscillation, among other things, of the flexible layer 4, since the aforementioned residual stress entails a force of elastic return that acts on the flexible layer 4 itself.

In detail, the supporting element 2 is made, for example, of a material chosen from: stainless steel, glass, an epoxy resin, bakelite, or a plastic material. Furthermore, the supporting element 2 is delimited at the top by a surface $S_2$, referred to hereinafter as "supporting surface" $S_2$. In addition, the supporting element 2 is delimited laterally by an edge surface B, parallel to an axis y.

The bonding layer 14 is made, for example, of a material chosen from: an epoxy resin, an adhesive with a silicone base or in any case a polymer base, an anodic gluing, or else a material designed to obtain bonding by covalent bonds activated by a plasma treatment. In addition, the bonding layer 14 extends over a portion of the supporting surface $S_2$, with which it is in direct contact. Without any loss of generality, in the embodiment illustrated in FIG. 1, the bonding layer 14 does not extend in cantilever fashion beyond the supporting element 2. In other words, the bonding layer 14 is delimited at the bottom by a respective surface, which is entirely in contact with the supporting surface $S_2$.

The flexible layer 4 is formed by a flexible material such as, for example, aluminium or a polymer chosen from among: Kapton, Mylar, polyethylene terephthalate (PET), or polyethylene naphthalate (PEN). In addition, the flexible layer 4 extends over the bonding layer 14, with which it is in direct contact. In particular, the flexible layer 4 is delimited at the top and at the bottom, respectively, by a first surface $S_{4a}$ and a second surface $S_{4b}$, referred to hereinafter as "first and second flexible surfaces" $S_{4a}$, $S_{4b}$.

Without any loss of generality, in the embodiment illustrated in FIG. 1, the flexible layer 4 overlies, at a distance, the same portion of the supporting surface $S_2$ overlaid by the bonding layer 14. Further, the flexible layer 4 extends in cantilever fashion with respect to the assembly formed by the supporting element 2 and by the bonding layer 14. The flexible layer 4 is thus laterally staggered with respect to the supporting element 2.

In greater detail, in ideal conditions of non-deformation, the flexible layer 4 extends in a direction x, which is orthogonal to the aforementioned axis y, stacked along which are, among other things, the supporting element 2, the gluing layer 14, and the flexible layer 4 itself. For completeness, likewise illustrated in FIG. 1 is an axis z of an orthogonal reference system x, y, z.

As described in greater detail hereinafter, the base layer 12 is made, for example, of a material (referred to hereinafter as "base material") chosen from: aluminium nitride (AlN), silicon dioxide ($SiO_2$), titanium nitride (TiN), or tantalum (Ta). This base material has a columnar polycrystalline structure. Further, the base layer 12 extends over the flexible layer 4, with which it is in direct contact, and is delimited at the top and at the bottom, respectively, by a first surface $S_{12a}$ and a second surface $S_{12b}$, referred to hereinafter as "first and second base surfaces" $S_{12a}$, $S_{12b}$.

In ideal conditions of non-deformation, the first and second base surfaces $S_{12a}$, $S_{12b}$ have a same rectangular shape in top plan view and are aligned along the axis y, without any loss of generality.

The second base surface $S_{12b}$ is in contact with a portion of the first flexible surface $S_{4a}$, said portion overlying in part, at a distance, a peripheral portion of the supporting element 2. In particular, a first (non-entire) portion of the second base surface $S_{12b}$ overlies, at a distance, the aforementioned peripheral portion of the supporting element 2, whereas a second portion of the second base surface $S_{12b}$ extends, in top plan view, outside the supporting element 2, but in any case within the first flexible surface $S_{4a}$. Consequently, in top plan view, the edge surface B is overlaid by the second base surface $S_{12b}$.

The first conductive layer 8 functions as first electrode and is arranged over the base layer 12, in direct contact with the first base surface $S_{12a}$. Without any loss of generality, the first conductive layer 8 has, in top plan view, the same shape as the base layer 12, with which it is aligned along the axis y. As described in greater detail hereinafter, the first conductive layer 8 may be made, for example, of a first conductive material chosen from among: molybdenum, aluminium, platinum, gold, tungsten, titanium, ruthenium, graphene, or else a copper and aluminium alloy.

As described in greater detail hereinafter, the first piezoelectric layer 6 is made of a first piezoelectric material, such as, for example, aluminium nitride (AlN) or a ternary compound of the latter, such as, for example, an alloy chosen from: ScAlN, YAlN, InAlN, CuAlN, CrAlN, or SmAlN. Once again by way of example, the first piezoelectric material may likewise be chosen from: ZnO, PZT (also known as lead zirconate titanate), $LiNbO_3$, $LiTaO_3$, and perovskites ($CaTiO_3$, $BaTiO_3$, etc.).

In particular, the first piezoelectric layer 6 is formed by a thin film, arranged over the first conductive layer 8, in direct contact with the latter. Furthermore, the first piezoelectric layer 6 is delimited at the top and at the bottom, respectively, by a first and surface $S_{6a}$ a second surface $S_{6b}$, referred to hereinafter as "first and second piezoelectric surfaces" $S_{6a}$, $S_{6b}$.

Without any loss of generality, in ideal conditions of non-deformation, the first and second piezoelectric surfaces $S_{6a}$, $S_{6b}$ have, in top plan view, the same rectangular shape and are vertically aligned along the axis y. Furthermore, the second piezoelectric surface $S_{6b}$ is entirely in contact with the first conductive layer 8, which is in turn delimited at the top and at the bottom respectively by a first surface $S_{8a}$ and a second surface $S_{8b}$, referred to hereinafter as "first and second conductive surfaces" $S_{8a}$, $S_{8b}$.

The first piezoelectric surface $S_{6a}$ (and thus also the second piezoelectric surface $S_{6b}$) has an area smaller than the area of the first conductive surface $S_{8a}$ (and thus also of the second conductive surface $S_{8b}$), which in turn, as mentioned previously, has an area smaller than the area of the first flexible surface $S_{4a}$. In addition, each of the first and second piezoelectric surfaces $S_{6a}$, $S_{6b}$ is set to overlie the edge surface B of the supporting element 2. Consequently, the first piezoelectric layer 6 comprises a first portion, which overlies, at a distance, the aforementioned peripheral portion of the supporting element 2, and a second portion, which, in top plan view, is located externally with respect to the supporting element 2. In top plan view, both the first portion and the second portion of the first piezoelectric layer 6 fall within the first conductive surface $S_{8a}$, and thus also within the first flexible surface $S_{4a}$. In other words, the first piezoelectric layer 6 extends in cantilever fashion with respect to the supporting element 2.

In greater detail, without any loss of generality, it is assumed that, in ideal conditions of non-deformation, the projection of the edge surface B on the first piezoelectric surface $S_{6a}$ or on the second piezoelectric surface $S_{6b}$, parallel to the axis y, divides the rectangular shape of this surface in two equal parts arranged specularly with respect to the projection itself. This enables maximization of the deformation to which the first piezoelectric layer 6 is subjected in use.

The second conductive layer 10 extends over the first piezoelectric layer 6, with which it is in direct contact. For instance, the second conductive layer 10 may be made of a second conductive material chosen from: molybdenum, aluminium, platinum, gold, tungsten, titanium, ruthenium, graphene, or else a copper and aluminium alloy.

The second conductive layer 10 is delimited at the top and at the bottom respectively by a third conductive surface $S_{10a}$ and a fourth conductive surface $S_{10b}$. Without any loss of generality, the third and fourth conductive surfaces $S_{10a}$, $S_{10b}$ have the same shape and are aligned along the axis y. Further, once again without any loss of generality, each of the third and fourth conductive surfaces $S_{10a}$, $S_{10b}$ has the same shape as the first and second piezoelectric surfaces $S_{6a}$, $S_{6b}$, with which it is aligned along the axis y.

In greater detail, without any loss of generality, the edge surface B defines a plane of symmetry PH for the assembly formed, not only by the first piezoelectric layer 6, but also by the base layer 12 and the first and second conductive layers 8, 10. In ideal conditions of non-deformation, the plane of symmetry PH divides this assembly into two equal specular parts. The geometrical centres of the first and second piezoelectric surfaces $S_{6a}$, $S_{6b}$ are thus coplanar with the edge surface B. In greater detail, in ideal conditions of non-deformation, the plane of symmetry PH is directed parallel to the axis y and perpendicular to the first piezoelectric layer 6, which overlies the edge that connects the edge surface B with the supporting surface $S_2$. Albeit not illustrated, there are, however, possible embodiments in which the edge surface B is transverse, but not perpendicular, with respect to the first piezoelectric layer 6.

The energy-harvesting device 1 further comprises a first pad and a second pad 22, made of conductive material, which extend on the supporting surface $S_2$, laterally staggered with respect to the bonding layer 14 and to the flexible layer 4. The first and second pads 20, 22 are electrically connected, respectively, to the first and second conductive layers 8, 10 by a first wire bonding 24 and a second wire bonding 26, respectively. Furthermore, the first and second pads 20, 22 may be connected in a per se known manner to an external device (not illustrated) for supplying the latter with the electric power obtained, as described hereinafter, from the energy-harvesting device 1.

In greater detail, in the embodiment illustrated in FIG. 1, the supporting element 2 has a thickness (measured along the axis y) comprised, for example, between 1 mm and 5 mm, the bonding layer 14 has a thickness comprised, for example, between 50 nm and 100 nm, the flexible layer 4 has a thickness comprised, for example, between 5 μm and 50 μm, the base layer 12 has a thickness comprised, for example, between 15 nm and 500 nm, the first conductive layer 8 has a thickness comprised, for example, between 5 nm and 500 nm, the first piezoelectric layer 6 has a thickness comprised, for example, between 300 nm and 3 μm, preferably between 300 nm and 1.4 μm, and the second conductive layer 10 has a thickness comprised, for example, between 5 nm and 1 μm. It is to be noted that in FIG. 1, as, on the other hand, also in the subsequent FIGS. 2-8, the layers are not illustrated in scale. Furthermore, the aforementioned range of 300 nm-1.4 μm bestows flexibility on the first piezoelectric layer 6, without causing any loss of the piezoelectric behaviour.

Figure 2A:
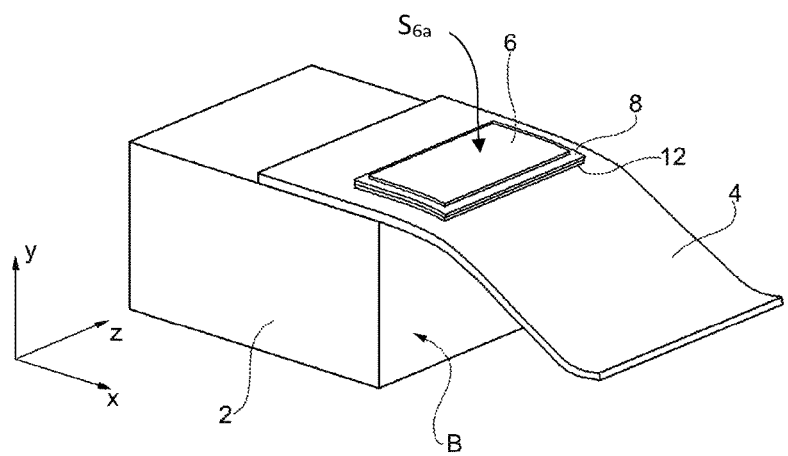
FIG. 2A is a schematic perspective view, with portions removed, of an embodiment of the present energy harvesting device.

As illustrated in FIG. 2, in top plan view, the first piezoelectric layer 6 has a dimension along the axis z smaller than the dimensions along the axis z of the supporting element 2 and of the flexible layer 4. Furthermore, in ideal conditions of non-deformation, the projection of the edge surface B parallel to the axis y divides the first piezoelectric layer 6 so that a first half of the latter overlies, at a distance, the supporting element 2, whereas a second half extends (in top plan view) outside the perimeter of the supporting element 2. Furthermore, it is assumed that the ratio between the area of either between the first and second piezoelectric surfaces $S_{6a}$, $S_{6b}$ and the first flexible surface $S_{4a}$ is less than 0.95. Lower values of this ratio bestow a greater flexibility on the energy-harvesting device 1.

Figure 3:
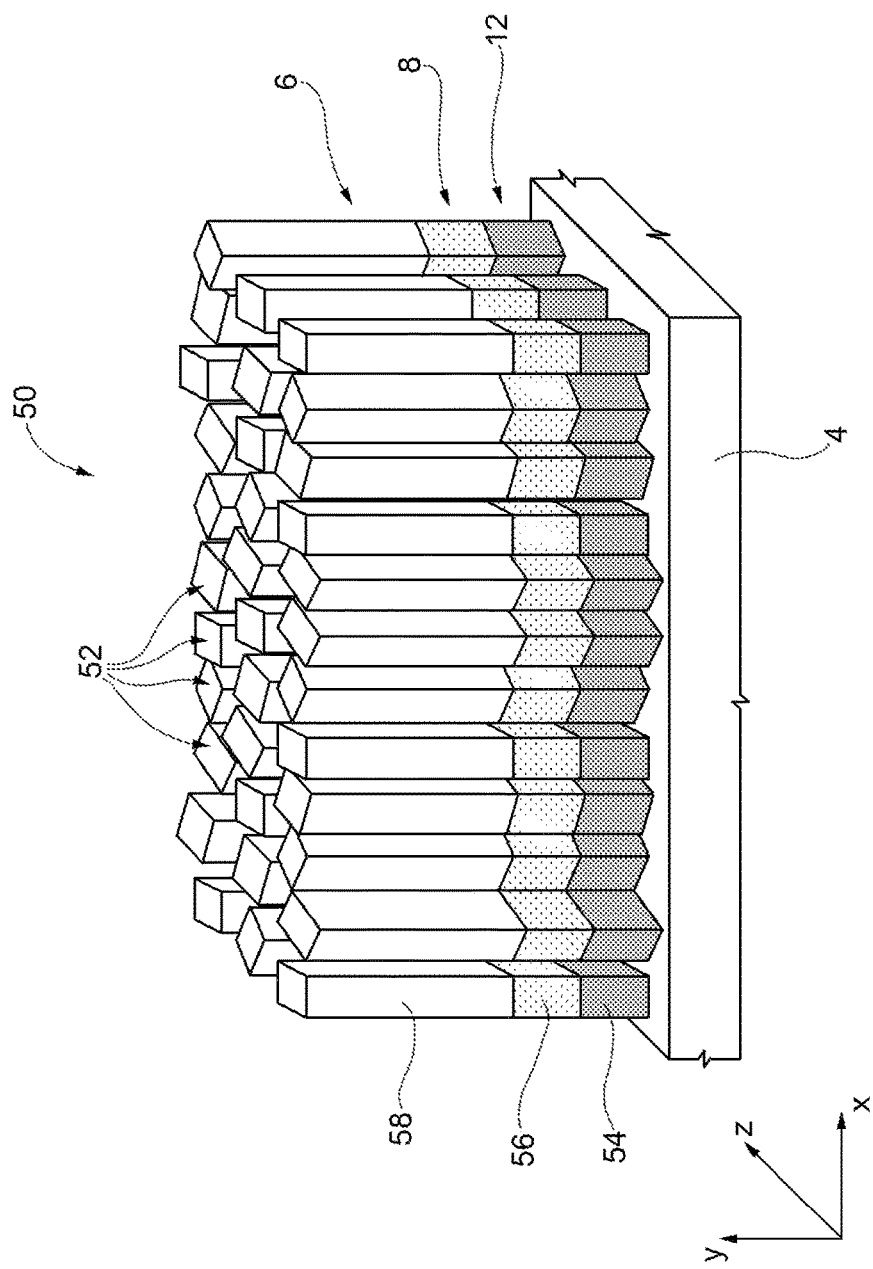
FIG. 3 is an enlarged schematic perspective view of the crystallographic structure of a portion of an embodiment of the present energy-harvesting device.

In even greater detail, the materials of the base layer 12, of the first piezoelectric layer 6, and of the first conductive layer 8 are such that they form a columnar structure 50 of a polycrystalline type, which comprises a plurality of columnar portions 52, as illustrated in FIG. 3.

Each columnar portion 52 extends substantially parallel to the axis y and includes a first sub-portion 54, a second sub-portion 56, and a third sub-portion 58, which are stacked on top of one another and form, respectively, the base layer 12, the first conductive layer 8, and the first piezoelectric layer 6. Consequently, the first, second, and third sub-portions 54, 56, 58 are made, respectively, of the aforementioned base material, the first conductive material, and the first piezoelectric material.

In greater detail, each one of the first, second, and third sub-portions 54, 56, 58 is formed by a corresponding grain (also known as "crystallite"); i.e., it is monocrystalline. Furthermore, the base material, the first conductive material, and the first piezoelectric material, and in particular the corresponding crystalline phases and the corresponding crystallographic orientations, are such that, to a first approximation, at the interface between the first sub-portion 54 and the second sub-portion 56 and at the interface between the second sub-portion 56 and the third sub-portion 58 no dislocation arises; i.e., there occurs a local epitaxy. In other words, the interface between the first and second sub-portions 54, 56 and the interface between the second and third sub-portions 56, 58 are substantially without lattice defects. Again in other words, given a columnar portion 52, the corresponding grains of the first, second, and third sub-portions 54, 56, 58 are grown on top of one another in crystalline form on a single grain, i.e., for forming a sort of single global grain. Each columnar portion 52 is thus of a so-called pseudomorphic (or coherent) type; i.e., it is formed by portions of layers that, albeit having different lattice parameters, mate with one another in the plane of growth, parallel to the plane x, z. In particular, the second sub-portion 56 adapts, in the plane of growth, to the lattice parameter of the first sub-portion 54 by tensile or compressive deformation; likewise, the third sub-portion 58 adapts, in the plane of growth, to the lattice parameter of the second sub-portion 56 by tensile or compressive deformation.

Purely by way of example, the first, second, and third sub-portions 54, 56, 58 of each columnar portion 52 of the embodiment illustrated in FIG. 3 are formed respectively, from a crystallographic standpoint, by:

- a first lattice of the hexagonal-close-packed (hcp) type, in which case the base material may, for example, be aluminium nitride (AlN);
- a second lattice of the body-centered-cubic (bcc) type, in which case the first conductive material may, for example, be molybdenum oriented according to the direction [110] perpendicular to the axis y; and
- a third lattice of the hexagonal-close-packed type, in which case the first piezoelectric material may, for example, be aluminium nitride (AlN) oriented according to a direction [0001] parallel to the axis y.

Albeit not illustrated in FIG. 3, the columnar portions 52 may join up to one another, for example, on account of the presence of chemical bonds that are set up between corresponding sub-portions of adjacent columnar portions.

The columnar structure 50 bestows on the energy-harvesting device 1 a high strength, notwithstanding the extremely small thickness. Furthermore, the columnar structure 50 may be obtained, for instance, by growing the first conductive layer 8 using low-pressure sputtering (e.g., with pressures lower than 0.005 mbar) with low roughness (e.g., having a mean square value of less than 5 nm) and with a compressive stress lower than −0.5 GPa. An example of columnar structure is described in Lee, Si-Hyung, Jeon-Kook Lee and Ki Hyun Yoon, "Growth of highly c-axis textured AlN films on Mo electrodes for film bulk acoustic wave resonators", Journal of Vacuum Science & Technology A 21, No. 1 (2002): 1-5.

This being said, from an electrical standpoint, the first piezoelectric layer 6 forms a sort of active region. In fact, when the energy-harvesting device 1, and in particular the flexible layer 4, are put in oscillation by a fluidic flow, which may not necessarily be turbulent, the first piezoelectric layer 6 undergoes mechanical stress, along the so-called axis 1 (in the present case, parallel to the axis x). This stress is particularly high also on account of the geometrical arrangement of the first piezoelectric layer 6 with respect to the edge surface B.

Application of a mechanical stress leads, within the first piezoelectric layer 6, to a displacement of charge, on account of the piezoelectric effect. In particular, designating by $T_1$ the mechanical stress along the axis x and designating by $E_3$ the electrical field directed along the axis y, we have $$D_3 = d_{13}T_{11} + \varepsilon_{33}E_3$$

where $D_3$ is the charge displacement along the axis y, $d_{13}$ is the piezoelectric coefficient for the axes x and y, $T_{11}$ is the stress along the axis x, and $\varepsilon_{33}$ is the dielectric permittivity along the axis y. Furthermore, by convention, it has been assumed that the biasing axis, i.e., the axis along which there occurs separation of charge due to the piezoelectric effect, is parallel to the axis y, this axis corresponding, if for example reference is made to the case where the first piezoelectric material is AlN or ZnO, to the so-called c-axis of the so-called unit cell.

The charge displacement may be measured as an open-circuit voltage, or else as a short-circuit current, between the first and second pads 20, 22.

In practice, the base layer 12 functions as tensile buffer, which guarantees the energy-harvesting device 1 a high resistance to deformation. Consequently, the first piezoelectric layer 6 may have a particularly small thickness, which, in turn, leads to the possibility of operating the energy-harvesting device 1 even with just a weak gas flow.

Figure 4:
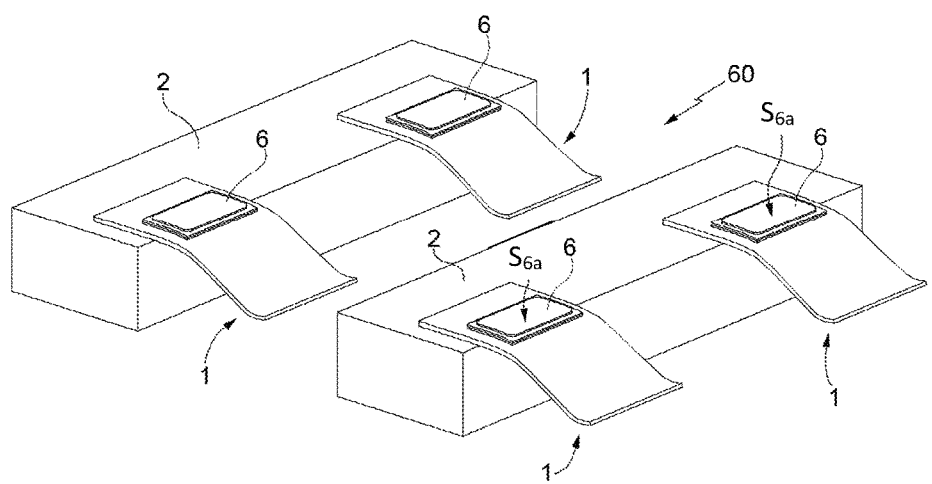
FIG. 4 is a schematic perspective view, with portions removed, of an energy-harvesting system including the present energy-harvesting device.

As illustrated in FIG. 4, a number of energy-harvesting devices 1 may form an energy-harvesting system 60. In this case, since each energy-harvesting device 1 may be considered, from an electrical standpoint, as a bipole, the energy-harvesting devices 1 may be connected together in series or in parallel (the electrical connections are not illustrated).

As illustrated also in FIG. 4, it is further possible for one supporting element to be shared between a number of energy-harvesting devices. Instead, in the embodiment illustrated in FIG. 4, each energy-harvesting device 1 includes its own flexible layer 4. For practical purposes, the absence of sharing of flexible layers between two or more energy-harvesting devices enables maximization of the overall deformation of the ensemble of the active regions present in the energy-harvesting system 60. There are in any case possible embodiments (not illustrated) in which the energy-harvesting system has a single flexible layer, which is shared between a number of energy-harvesting devices 1; i.e., it has a number of active regions. In this case, the energy-harvesting devices that share the flexible layer supply voltages/currents that are in phase with one another.

Figure 2B:
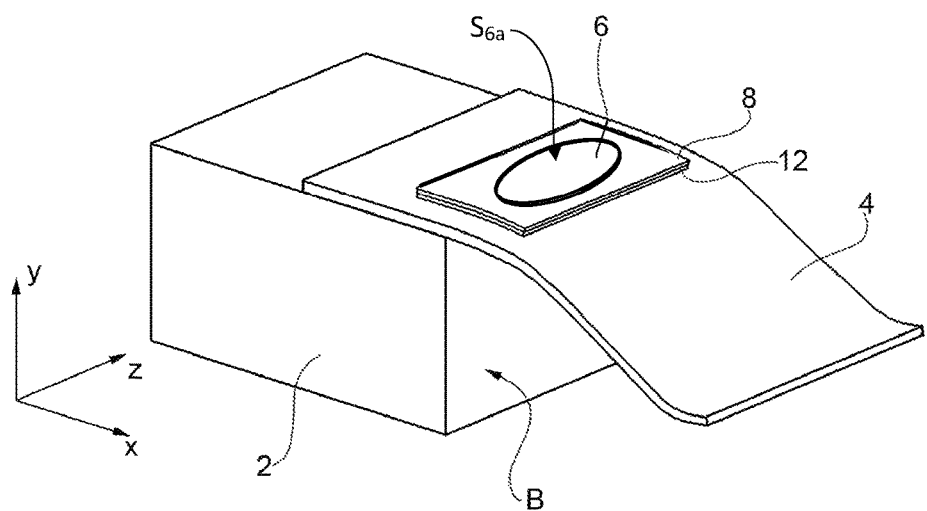
FIG. 2B is a schematic perspective view, with portion removed, of another embodiment of the present energy harvesting device.

Irrespective of the number of energy-harvesting devices present, it is further possible for each one of the first and second piezoelectric surfaces $S_{6a}$, $S_{6b}$ to have a shape without vertices as illustrated in FIG. 2B. For instance, as illustrated again in FIG. 4, the first and second piezoelectric surfaces $S_{6a}$, $S_{6b}$ may have the shape of a rectangle with rounded vertices. Further, even though not illustrated, embodiments are possible in which the first and second piezoelectric surfaces $S_{6a}$, $S_{6b}$ have the shape of a polygon with rounded vertices, or else that of a circle or an ellipse (as shown in FIG. 2B). The presence of rounded vertices bestows a greater strength on the first piezoelectric layer 6, since it reduces the likelihood of cracks forming within the latter.

Figure 5:
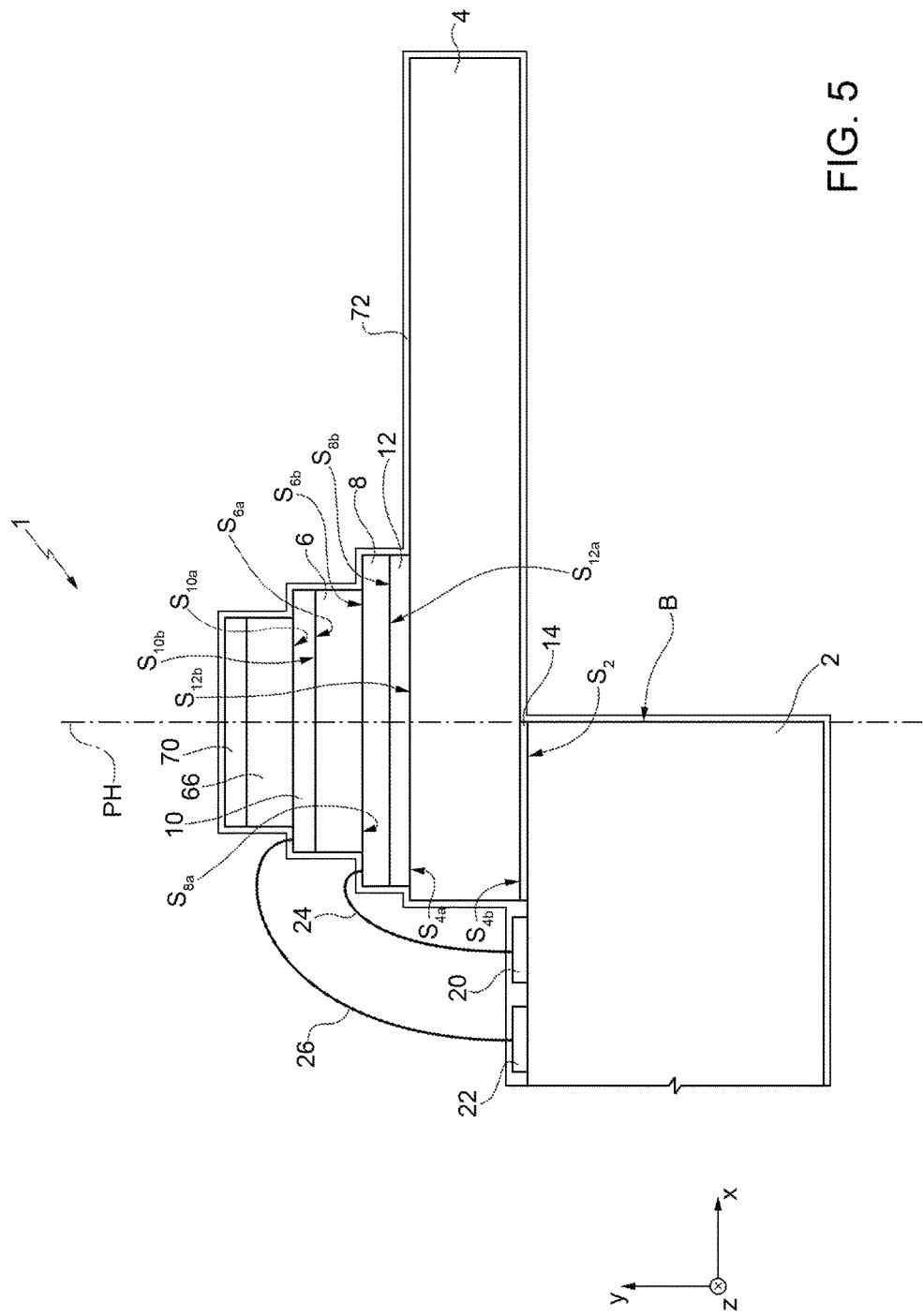

As illustrated in FIG. 5, it is further possible for the energy-harvesting device 1 to comprise a second piezoelectric layer 66, arranged over the second conductive layer 10, with which it is in direct contact, and made of a second piezoelectric material, which is for example the same as the first piezoelectric material. In this case, the energy-harvesting device 1 further comprises a third conductive layer 70, arranged over the second piezoelectric layer 66, with which it is in direct contact. Further, the first wire bonding 24 connects, to the first pad 20, both the first conductive layer 8 and the third conductive layer 70 (the latter connection not being illustrated in FIG. 5), which are then set, in use, at a same potential. Since, in use, also the second piezoelectric layer 66 undergoes deformation, it is possible to increase energy harvesting by the energy-harvesting device 1.

Irrespective of the presence of the second piezoelectric layer 66 and of the third conductive layer 70, the energy-harvesting device 1 may further comprise a coating layer 72 (illustrated in FIG. 5), formed by dielectric material, such as, for example, parylene. In particular, the coating layer 72 functions as passivation layer and coats the exposed portions of the flexible layer 4, of the base layer 12, of the first conductive layer 6, of the first piezoelectric layer 6, of the second conductive layer 10, and, if present, of the second piezoelectric layer 66 and of the third conductive layer 70. Furthermore, the coating layer 72 coats the first and second pads 20, 22, as well as the first and second wire bondings 24, 26, even though the latter characteristic is not illustrated in FIG. 5, for reasons of clarity. Furthermore, preferably, the coating layer 72 coats the exposed portions of the supporting element 2.

For practical purposes, the coating layer 72 electrically insulates the energy-harvesting device 1, but for a first terminal and a second terminal (not illustrated), which are electrically connected to the first and second pads 20, 22, respectively, and are designed to be electrically connected to the outside world. Furthermore, the coating layer 72 bestows further strength on the energy-harvesting device 1 and functions as barrier in regard, for example, to water, oxygen and, more in general, any possible chemical agents.

Figure 6:
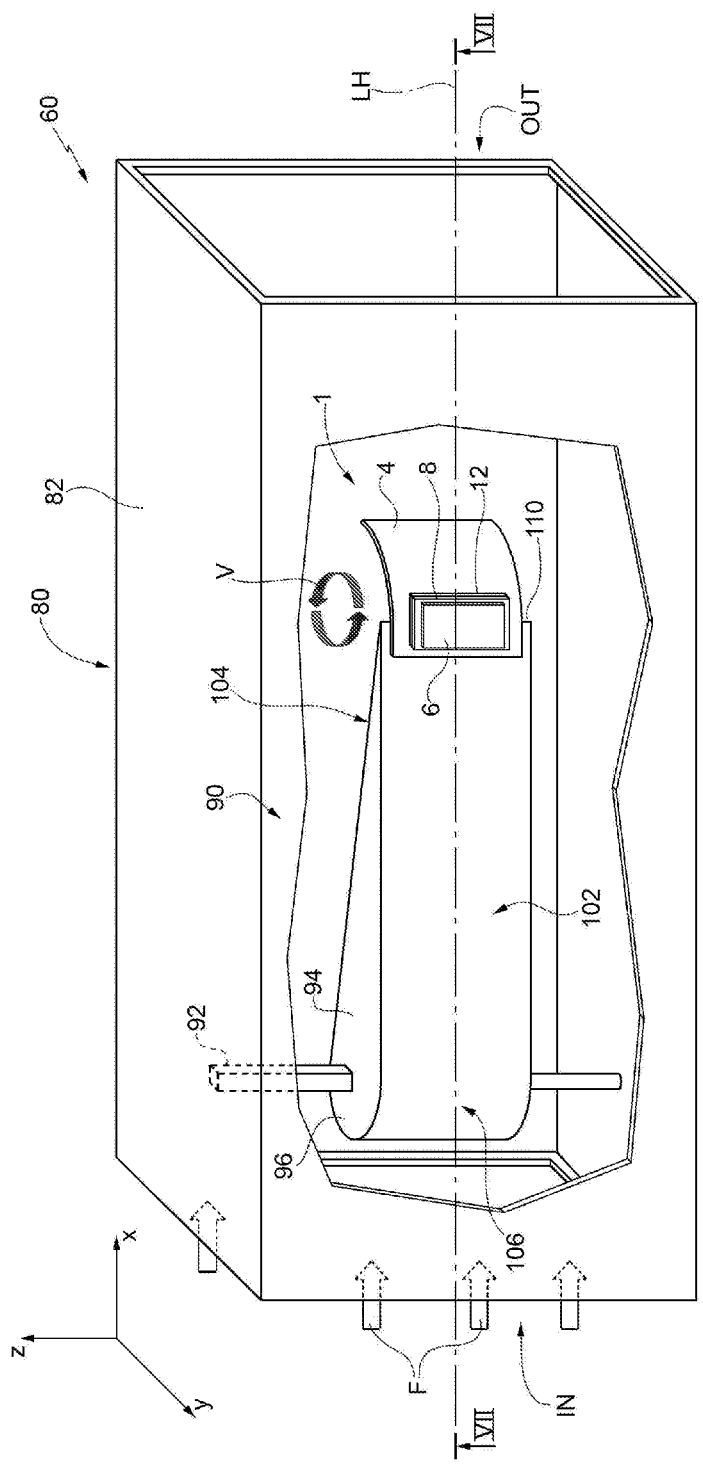
FIG. 6 is a schematic perspective view, with portions removed, of a further energy-harvesting system including the present energy-harvesting device.
Figure 7:
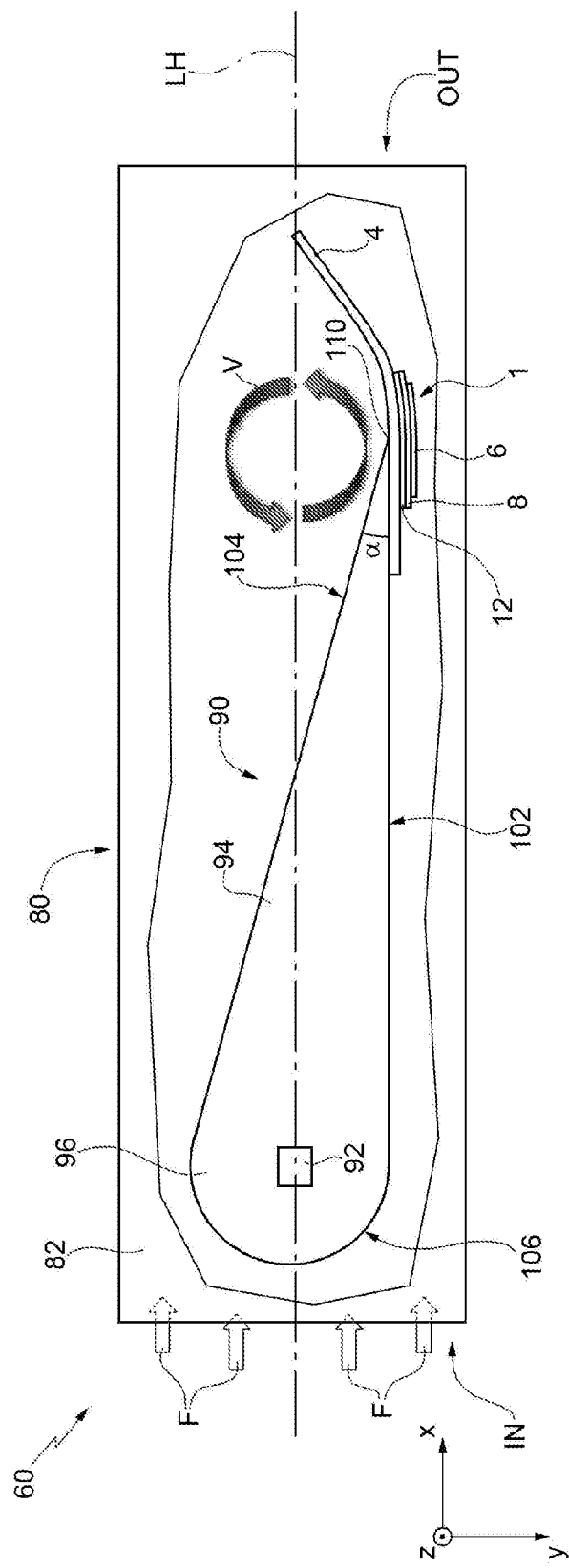
FIG. 7 is a schematic cross-sectional view, with portions removed, of the system illustrated in FIG. 6, taken along the lines of section VII-VII represented in FIG. 6 (FIGS. 6 and 7 have a different scale)

FIGS. 6 and 7 show a further embodiment of the energy-harvesting system 60, which, without any loss of generality, includes just one energy-harvesting device 1. Furthermore, according to this embodiment, the energy-harvesting system 60 comprises a container 80, which has a tubular shape and houses the energy-harvesting device 1.

In detail, the container 80 has, for example, a hollow parallelepipedal shape, and thus comprises four side walls 82, but is without the two bases, so that it defines an inlet opening IN and an outlet opening OUT, which may be traversed, in use, by the fluidic flow (represented by the arrows F). The container 80 may then channel the fluidic flow onto the energy-harvesting device 1. Furthermore, in a per se known manner, the orientation of the container 80 with respect to the direction of the fluidic flow may be varied, by using an actuator (not illustrated), so that the direction of the fluidic flow is parallel to the longitudinal axis LH of the container 80. Furthermore, in what follows it is assumed, without any loss of generality, that the fluidic flow is of a laminar type.

The energy-harvesting system 60 further comprises a vortex-generating element 90 of a rigid type, which, without any loss of generality, is constrained to the container 80 by a connecting rod 92, which is in turn fixed with respect to the container 80. Even though not described any further, embodiments are, however, possible in which the connecting rod 92 is constrained to the container 80, but may turn about its own longitudinal axis, or else in which the connecting rod 92 is fixed with respect to the container 80, but the vortex-generating element 90 may turn about the longitudinal axis of the connecting rod 92, in which case the vortex-generating element 90 orients itself according to the fluidic flow.

The vortex-generating element 90 comprises a portion 94 shaped like a prism with a triangular base (with its height orthogonal to the longitudinal axis LH) and a cylindrical portion 96 made of a single piece. Consequently, the vortex-generating element 90 is delimited by a first plane wall 102 and a second plane wall 104, which are inclined by an angle $\alpha$ with respect to one another, and by a connecting wall 106, which connects the first and second plane walls 102, 104 and has a curved shape. Furthermore, the first and second plane walls 102, 104 contact one another along a line of contact 110, which forms an edge of the vortex-generating element 90 and is arranged orthogonal to the longitudinal axis LH of the container 80.

The energy-harvesting device 1 is mechanically coupled to the vortex-generating element 90. In particular, the energy-harvesting device 1 is without the supporting element 2 since the vortex-generating element 90 itself functions as support. Consequently, the flexible layer 4 is constrained, at one of its ends, to the first plane wall 102. It follows that, in ideal conditions of non-deformation, the flexible layer 4 and the first piezoelectric layer 6 extend parallel to the first plane wall 102, the flexible layer 4 being set between the first plane wall 102 and the first piezoelectric layer 6.

In greater detail, the first piezoelectric layer 6 is coupled to the vortex-generating element 90 so that, without any loss of generality, an imaginary plane passing through the line of contact 110 and perpendicular to the first plane wall 102 divides (in ideal conditions of non-deformation) the first piezoelectric layer 6 into two equal portions, arranged specular to one another with respect to the aforesaid imaginary plane. Furthermore, as is evident from FIG. 7, a first one between these two portions of the first piezoelectric layer 6 extends on one side with respect to the imaginary plane, together with the first plane wall 102, whereas the second portion extends on the other side. In other words, in ideal conditions of non-deformation, the first portion of the first piezoelectric layer 6 is aligned along the axis y with respect to a corresponding portion of the first plane wall 102 whereas the second portion extends beyond the imaginary plane, on the opposite side with respect to the first plane wall 102. In yet other words, assuming as vertical direction a direction parallel to the axis y, the first portion of the first piezoelectric layer 6 overlies, at a distance, the corresponding portion of the first plane wall 102, whereas the second portion of the first piezoelectric layer 6 extends in cantilever fashion with respect to the first plane wall 102.

In the presence of the laminar fluidic flow, a vortex V is formed in the proximity of the line of contact 110. In particular, the vortex V is formed, with respect to the first plane wall 102, on the side opposite to the side on which the first piezoelectric layer 6 is located. The vortex V is generated for interacting mechanically with the flexible layer 4 in order to cause a dynamic deformation of the flexible layer 4. In particular, since the flexible layer 4 has a portion that extends in cantilever fashion from the first plane wall 102, the presence of the vortex V entails curving of this portion, which tends to approach the vortex V. This entails, among other things, deformation of the first piezoelectric layer 6. Following upon its formation, the vortex V moves away from the place where it is generated, with consequent release of the aforementioned flexible-layer portion 4. There thus occurs a counter-deformation of the first piezoelectric layer 6. Consequently, an a.c. voltage is set up in use between the first and second pads 20, 22.

Even though not illustrated, further possible is an embodiment of the energy-harvesting system 60 of the type illustrated in FIGS. 6 and 7, but without the container 80.

Albeit not illustrated, embodiments are further possible in which, within the container 80, a number of energy-harvesting devices 1 are present, each of which is mechanically coupled to a corresponding vortex-generating element. The energy-harvesting devices 1 may be electrically connected together in series or in parallel. Furthermore, the vortex-generating elements, and thus the energy-harvesting devices 1, may all be coupled to the connecting rod 92, on top one another.

Figure 8:
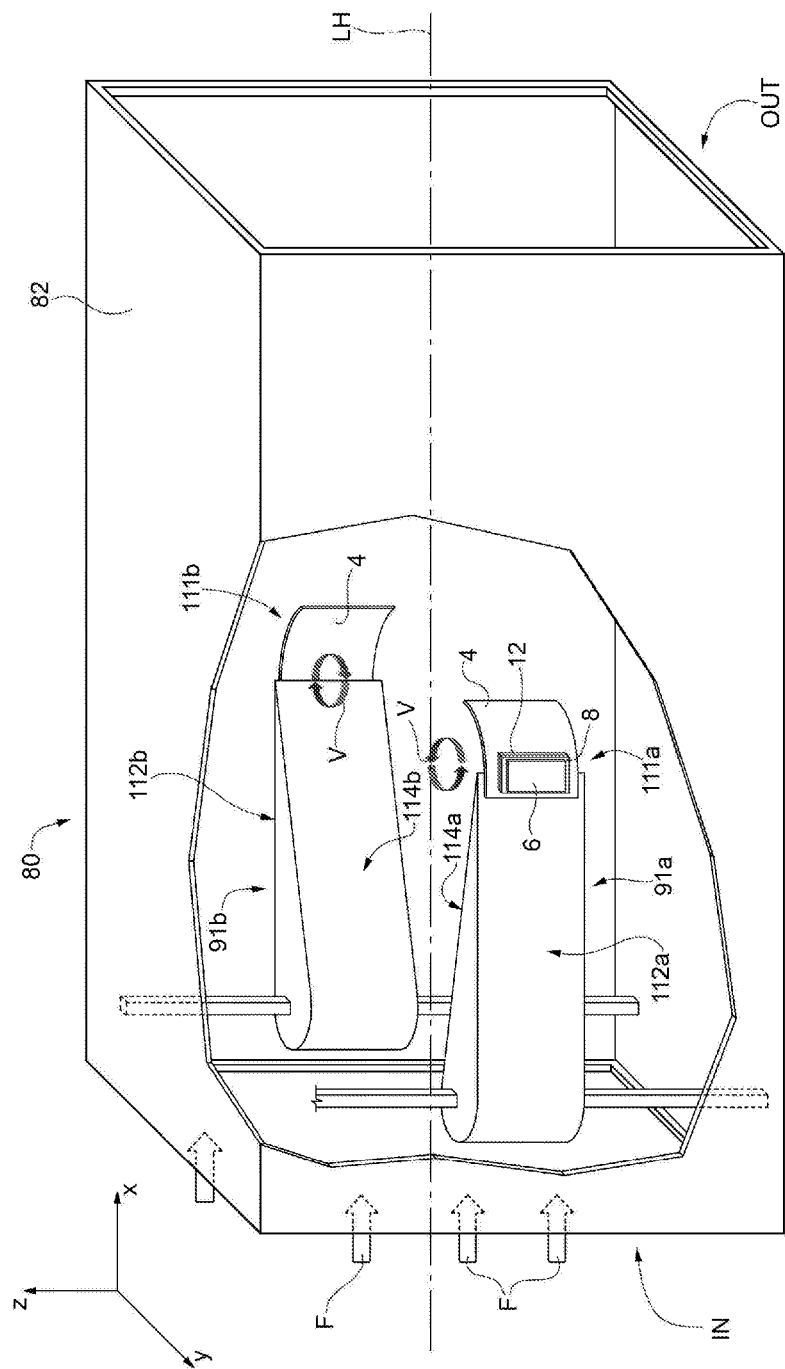
FIG. 8 is a schematic perspective view, with portions removed, of a further energy-harvesting system including the present energy-harvesting device.

As illustrated in FIG. 8, embodiments are further possible comprising a first energy-harvesting device and a second energy-harvesting device, designated by 111a and 111b, respectively, which are arranged within the container 80, are the same as one another, and are coupled, respectively, to a first vortex-generating element and a second vortex-generating element, designated by 91a, 91b, respectively, which are the same as one another.

The first and second vortex-generating elements 91a, 91b are arranged so that the respective first plane walls (designated, respectively, by 112a and 112b) are parallel to one another and aligned along the axis y. Further, the first and second vortex-generating elements 91a, 91b are oriented to be arranged specularly with respect to an axis parallel to the longitudinal axis LH of the container 80. Consequently, the second plane walls of the first and second vortex-generating elements 91a, 91b (designated by 114a and 114b, respectively) are arranged crosswise with respect to one another and are arranged between the first plane wall 112a of the first vortex-generating element 91a and the first plane wall 112b of the second vortex-generating element 91b. Furthermore, the first and second energy-harvesting devices 111a, 111b are coupled to the first and second vortex-generating elements 91a, 91b so that they also are arranged specularly with respect to the longitudinal axis LH of the container 80.

In the presence of a fluidic flow, the first and second vortex-generating elements 91a, 91b cause formation of a pair of vortices V. It consequently happens that the flexible layers 4 of the first and second energy-harvesting devices 111a, 111b bend towards the longitudinal axis LH of the container 80, causing deformation of the corresponding first piezoelectric layers 6. The subsequent recession of the vortices V from the respective places where they are generated entails release of the first piezoelectric layers 6. Consequently, in use, the first and second energy-harvesting devices 111a and 111b supply, respectively, a first a.c. voltage and a second a.c. voltage, which are at a predefined phase relation with respect to one another, which enables maximization of energy harvesting. In addition, the arrangement of the first and second energy-harvesting devices 111a and 111b is such that, when they oscillate, they do not impact against the walls of the container 80 and thus do not get damaged.

The advantages that the present energy-harvesting device affords emerge clearly from the foregoing description.

In particular, the present energy-harvesting device enables generation of appreciable voltages even starting from a gaseous flow. For instance, assuming having available an embodiment with an overall thickness (excluding the supporting element) of approximately 26.5 µm, and in which the flexible layer 4 has a thickness of 25 µm, and assuming operation in a gaseous flow at a rate of 1.5 m/s, it is possible to obtain a voltage of approximately 170 mV, i.e., a voltage higher than what may be obtained with known systems based upon the use of PVDF layers of comparable thickness.

Furthermore, the present energy-harvesting device does not envisage any constraint regarding the operating frequency since it does not avail itself of any element that must necessarily operate at a corresponding resonance frequency. In this connection, the deformation of the active region is substantially independent of the frequency of oscillation of the flexible layer 4.

It is further possible to show that the present energy-harvesting device is particularly quiet in operation.

Once again, the present energy-harvesting device is suited to forming modular systems having, for example, three-dimensional configurations, i.e., three-dimensional distributions in space of the active regions. Furthermore, the present energy-harvesting device may be used for measuring the rate of the fluidic flow on the basis of energy harvesting.

Finally, it is evident that modifications and variations may be made to the present energy-harvesting device, without departing from the scope of the present invention, as defined by the annexed claims.

For instance, the relative arrangement of two or more elements of the present energy-harvesting device may be different from what has been described. For instance, the position of the first piezoelectric layer with respect to the supporting element, or else to the flexible layer, may be different from what has been described. On the other hand, the supporting element itself may be absent, or in any case may have a different shape from what has been described, in which case the flexible layer is appropriately constrained to it in a per se known manner. Also the edge surface may have a different shape and may, for example, be at least partially curved, or in any case may be inclined in a different way. In this connection, in general the supporting element defines an edge such that, given an imaginary plane that contains the edge and is perpendicular to the first piezoelectric layer, this imaginary plane divides the first piezoelectric layer into two portions, which, in ideal conditions of non-deformation, are preferably equal and arranged specularly.

Furthermore, the connections between the first and second pads 20, 22 and, respectively, the first and second conductive layers 8, 10 may be of a type different from what has been described. For instance, they may be formed by conductive paths that extend on the coating layer 72 and are in electrical contact with the first and second conductive layers 8, 10 and with the first and second pads 20, 22 thanks to so-called "conductive vias".

It is further possible for the first, second, and third conductive layers 8, 10, 70 to be electrically connected in a different way. For instance, the first wire bonding 24 may connect the first pad 20 to the first conductive layer 8, whereas the second wire bonding 26 may connect the second pad 22 to the third conductive layer 70, in which case the second conductive layer 10 may be floating.

It is likewise possible for the base layer, the first conductive layer, the first and (if present) second piezoelectric layers, and the second and (if present) third conductive layers to have shapes different from what has been illustrated and described herein.

Finally, as mentioned previously, the base material may be different from the first piezoelectric material.

The invention claimed is:

1. A system comprising a first device for harvesting energy from a fluidic flow, said first energy-harvesting device comprising a flexible structure including:
   a base layer;
   a first conductive layer, made of a first conductive material and arranged on top of the base layer; and
   a first piezoelectric layer, made of a first piezoelectric material and arranged on top of the first conductive layer; and
   wherein the base layer, the first conductive layer, and the first piezoelectric layer form a crystalline structure including a plurality of pseudomorphic portions;
   a flexible layer, configured to be put in oscillation by the fluidic flow, the base layer being arranged on top of the flexible layer;
   a first vortex-generating element mechanically coupled to said first energy-harvesting device and configured to generate, in the presence of the fluidic flow, a vortex that interacts with at least part of the flexible layer;
   a second energy-harvesting device and a second vortex-generating element, which is mechanically coupled to the second energy-harvesting device,
   wherein the first and second vortex-generating elements are arranged specularly with respect to an axis, and the first and second energy-harvesting devices are arranged specularly with respect to the axis;
   wherein each of the first and second vortex-generating elements is delimited in part by a respective first portion of side wall and by a respective second portion of side wall, which are inclined with respect to one another and are connected, to form an edge arranged orthogonally with respect to the axis, said respective first portion of side wall being parallel to the axis; and
   wherein the flexible layers of the first and second energy-harvesting devices are fixed, respectively, to the first portion of side wall of the first vortex-generating element and to the first portion of side wall of the second vortex-generating element.

2. The system according to claim 1, wherein each pseudomorphic portion has a columnar shape and includes a first interface and a second interface.

3. The system according to claim 1, wherein the first piezoelectric layer has a thickness comprised between 300 nm and 1.4 µm.

4. The system according to claim 1, wherein the first piezoelectric layer forms a first main surface, which in top plan view has a shape without vertices.

5. The system according to claim 1, wherein the base layer has a thickness comprised between 15 nm and 500 nm.

6. The system according to claim 1, wherein the first energy-harvesting device further comprises: a second conductive layer, arranged on top of the first piezoelectric layer, a second piezoelectric layer, arranged on top of the second conductive layer, and a third conductive layer, arranged on top of the second piezoelectric layer.

7. The system according to claim 1, wherein the flexible layer is made of a polymeric material.

8. The system according to claim 1, wherein the flexible layer has a thickness comprised between 5 µm and 50 µm.

9. The system according to claim 1, further comprising a rigid supporting element, a portion of the flexible layer being fixed to the rigid supporting element; and wherein the first piezoelectric layer extends in cantilever fashion with respect to the rigid supporting element.

10. The system according to claim 1, further comprising a container, the first energy-harvesting device and the first vortex-generating element being arranged within the container, which is configured to receive the fluidic flow and to channel the fluidic flow onto the first vortex-generating element.

\* \* \* \* \*